(12) United States Patent
Wehlus et al.

(10) Patent No.: US 9,774,006 B2
(45) Date of Patent: Sep. 26, 2017

(54) RADIATION-EMITTING APPARATUS HAVING A SCATTER LAYER

(71) Applicant: OSRAM OLED GmbH, Regensburg (DE)

(72) Inventors: Thomas Wehlus, Lappersdorf (DE); Johannes Rosenberger, Regensburg (DE)

(73) Assignee: OSRAM OLED GmbH (DE)

( * ) Notice: Subject to any disclaimer, the term of this patent is extended or adjusted under 35 U.S.C. 154(b) by 85 days.

(21) Appl. No.: 14/907,628

(22) PCT Filed: Jul. 17, 2014

(86) PCT No.: PCT/EP2014/065440
§ 371 (c)(1),
(2) Date: Jan. 26, 2016

(87) PCT Pub. No.: WO2015/011027
PCT Pub. Date: Jan. 29, 2015

(65) Prior Publication Data
US 2016/0164037 A1 Jun. 9, 2016

(30) Foreign Application Priority Data

Jul. 26, 2013 (DE) ........................ 10 2013 108 039

(51) Int. Cl.
*H01L 51/52* (2006.01)
(52) U.S. Cl.
CPC ...... *H01L 51/5268* (2013.01); *H01L 51/5271* (2013.01); *H01L 51/5275* (2013.01); *H01L 2251/5323* (2013.01)
(58) Field of Classification Search
CPC ............. H01L 51/5271; H01L 51/5275; H01L 51/0097; H01L 2251/5323
See application file for complete search history.

(56) References Cited

U.S. PATENT DOCUMENTS

| 7,982,396 B2 | 7/2011 | Cok |
| 2008/0048557 A1 | 2/2008 | Birnstock et al. |

(Continued)

FOREIGN PATENT DOCUMENTS

| CN | 1508890 | 6/2004 |
| DE | 10 2004 035 965 B4 | 7/2007 |

(Continued)

OTHER PUBLICATIONS

Notification of the First Office Action dated Sep. 29, 2016, of corresponding Chinese Application No. 201480042247.8 in English.

*Primary Examiner* — Hoai V Pham
(74) *Attorney, Agent, or Firm* — DLA Piper LLP (US)

(57) ABSTRACT

A radiation emitting apparatus including a substrate, at least one layer sequence arranged on the substrate and producing electromagnetic radiation in a wavelength range, having at least one first electrode surface, at least one second electrode surface, and at least one functional layer between the first electrode surface and the second electrode surface, wherein the functional layer produces electromagnetic radiation in the wavelength range in a switched-on operating state, and a scatter layer having a first region and a second region, wherein radiation produced by the functional layer is directly incident on the scatter layer only in the first region of the scatter layer, and the scatter layer at least partially scatters radiation incident upon the first region of the scatter layer so that said radiation enters the second region of the scatter layer.

20 Claims, 3 Drawing Sheets

(56) References Cited

U.S. PATENT DOCUMENTS

| | | |
|---|---|---|
| 2012/0138937 A1 | 6/2012 | Jo et al. |
| 2013/0026517 A1 | 1/2013 | Lin et al. |
| 2014/0264316 A1 | 9/2014 | Setz et al. |
| 2016/0155988 A1* | 6/2016 | Kuroki ............... H01L 51/0097 257/40 |

FOREIGN PATENT DOCUMENTS

| | | |
|---|---|---|
| DE | 10 2011 079 012 A1 | 1/2013 |
| DE | 10 2011 086 168 A1 | 5/2013 |
| EP | 1 533 853 A2 | 5/2005 |
| EP | 1 603 367 A1 | 12/2005 |
| EP | 1 930 965 A1 | 6/2008 |
| JP | 2005-38681 A | 2/2005 |
| JP | 2009-211885 A | 9/2009 |
| WO | 2010/089678 A1 | 8/2010 |
| WO | 2010/100584 A2 | 9/2010 |

* cited by examiner

RADIATION-EMITTING APPARATUS HAVING A SCATTER LAYER

TECHNICAL FIELD

This disclosure relates to a radiation-emitting apparatus.

BACKGROUND

Radiation-emitting apparatuses and in particular organic light-emitting diodes (OLEDs) are suitable as large-scale, thin lighting elements. In many applications, it is desirable that the apparatus emits electromagnetic radiation over the entire extent of one of its surfaces, wherein the luminous density of the radiation is as homogeneous as possible over the surface. However, different circumstances mean that in known radiation-emitting apparatuses no radiation is emitted in some regions of the radiating surface. This can be because e.g. these regions are covered by contacting elements or insulating elements or because no active radiation-emitting layer is formed in these regions.

In particular, OLEDs formed to be transparent over the entire surface also illuminate only in the active surface. The edge regions do not illuminate as there is no active surface at this location.

It could therefore be helpful to provide a radiation-emitting apparatus that emits electromagnetic radiation over a larger extent, in particular the entire extent of at least one of its surfaces. In particular, it could be helpful to enable the radiation-emitting apparatus to also emit radiation at the location where this is conventionally not possible e.g. for the reasons described above. It could further be helpful to achieve the most homogeneous possible luminous density over the radiation-emitting surface or to achieve the subjective perception of the most homogeneous possible luminous density over the radiation-emitting surface.

SUMMARY

We provide a radiation emitting apparatus including a substrate, at least one layer sequence arranged on the substrate and producing electromagnetic radiation in a wavelength range, having at least one first electrode surface, at least one second electrode surface, and at least one functional layer between the first electrode surface and the second electrode surface, wherein the functional layer produces electromagnetic radiation in the wavelength range in a switched-on operating state, and a scatter layer having a first region and a second region, wherein radiation produced by the functional layer is directly incident on the scatter layer only in the first region of the scatter layer, and the scatter layer at least partially scatters radiation incident upon the first region of the scatter layer so that said radiation enters the second region of the scatter layer.

We further provide a radiation emitting apparatus including a substrate, at least one layer sequence arranged on the substrate and producing electromagnetic radiation in a wavelength range, having at least one first electrode surface, at least one second electrode surface, and at least one functional layer between the first electrode surface and the second electrode surface, wherein the functional layer produces electromagnetic radiation in the wavelength range in a switched-on operating state, and a scatter layer having a first region and a second region, wherein radiation produced by the functional layer is directly incident on the scatter layer only in the first region of the scatter layer, the scatter layer comprises a matrix material and scatter particles having a refractive index different from that of the matrix material, the scatter particles in the first region of the scatter layer take up 0.1 to 5 volume percent of the scatter layer and the scatter particles in the second region of the scatter layer take up 2 to 20 volume percent of the scatter layer, and the scatter layer at least partially scatters radiation incident upon the first region of the scatter layer so that said radiation enters the second region of the scatter layer.

We yet further provide a radiation emitting apparatus including a substrate, at least one layer sequence arranged on the substrate and producing electromagnetic radiation in a wavelength range, having at least one first electrode surface, at least one second electrode surface, and at least one functional layer between the first electrode surface and the second electrode surface, wherein the functional layer produces electromagnetic radiation in the wavelength range in a switched-on operating state, and a scatter layer having a first region and a second region, wherein radiation produced by the functional layer is directly incident on the scatter layer only in the first region of the scatter layer, the scatter layer at least partially scatters radiation incident upon the first region of the scatter layer so that said radiation enters the second region of the scatter layer, and the radiation-emitting apparatus is formed at least in a sub-region or overall to be transparent or at least translucent.

DETAILED DESCRIPTION

Our radiation-emitting apparatus may comprise a substrate and at least one layer sequence arranged on the substrate and produces electromagnetic radiation in a wavelength range. The layer sequence comprises at least one first electrode surface, at least one second electrode surface and at least one functional layer between the first electrode surface and the second electrode surface. The functional layer produces electromagnetic radiation in the wavelength range in a switched-on operating state. The apparatus further comprises a radiation-emitting surface.

The fact that a layer or an element is arranged or applied "on" or "over" another layer or another element or even "between" two other layers or elements may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other layer or the one element and the other element.

Furthermore, the radiation-emitting apparatus comprises a scatter layer comprising a first region and a second region, wherein, in an orthogonal projection onto the scatter layer, the particular region of the functional layer from which in a switched-on operating state radiation is incident upon the scatter layer, is projected onto the first region of the scatter layer. Therefore, radiation produced by the functional layer is directly incident upon the scatter layer substantially only in the first region of the scatter layer.

The scatter layer may be arranged between the layer sequence and the substrate, in particular between the first electrode surface and the substrate.

First and second regions of the apparatus, which in a plan view of the scatter layer cover the first and second region of the scatter layer respectively, correspond to the first and second regions of the scatter layer. That is to say, the first region of the apparatus is the particular region of the apparatus which in an orthogonal projection onto the scatter layer is projected onto the first region of the scatter layer, and the second region of the apparatus is the particular region of the apparatus which in an orthogonal projection onto the scatter layer is projected onto the second region of the scatter layer.

The wavelength range is preferably a range in the visible electromagnetic spectrum.

Preferably, the first region of the apparatus adjoins the second region of the apparatus. The first region can be a central region and the second region can be an edge region. The second region can at least partially surround the first region, in particular in an annular manner, and can have a substantially constant width. The shape of the first region can correspond to the shape of the entire apparatus. Preferably, the first region is larger than the second region. Located in the second region can be contact elements, insulating elements and further elements which in a conventional radiation-emitting apparatus would prevent the radiation-emitting surface from emitting radiation in the second region. Optionally or in addition, the first region of the apparatus can be a region in which the functional layer is formed, and the second region of the apparatus can be a part in which no functional layer is formed. Therefore, the second region can be free of radiation-producing elements.

The radiation-emitting apparatus can be formed at least in a sub-region or overall to be transparent or at least translucent and in particular as a transparent OLED. In particular, the first region of the apparatus and also the second region of the apparatus can be formed to be transparent or at least translucent. In this case, contact elements, insulating elements or the like located in the second region are likewise formed to be transparent or at least translucent.

The scatter layer is formed to at least partially scatter radiation incident upon the first region of the scatter layer such that the radiation enters the second region of the scatter layer. Preferably, the scatter layer is formed to at least partially scatter radiation incident upon the first region of the scatter layer such that the radiation propagates in the scatter layer and within the scatter layer enters the second region of the scatter layer. The scattered radiation can enter the second region of the scatter layer in a linear manner from the scatter point or can be reflected at least once on a boundary surface of the scatter layer before it enters the second region of the scatter layer. Preferably, the scattered radiation can be totally reflected on at least one boundary surface, particularly preferably on both boundary surfaces of the scatter layer if it propagates at a sufficiently flat angle with respect to the boundary surfaces. This ensures that the scattered radiation can propagate in the scatter layer substantially without any losses so that an as large as possible portion of the radiation can enter the second region of the scatter layer. The scatter layer thus acts as a waveguide. Radiation which is scattered at an angle at which it is totally reflected on the boundary surfaces of the scatter layer is effectively optically insulated from the first and second electrode surfaces as well as the functional layer and no longer interacts therewith. Depending upon the angle at which radiation is emitted by the functional layer, it can also be reflected at other boundary surfaces and propagate in other layers.

In the first region of the apparatus, the functional layer may be formed and configured to emit radiation in the direction of the scatter layer and in the second region of the apparatus either no functional layer is formed or by reason of covering elements, e.g. contacting elements or insulating elements, no radiation can be emitted by the functional layer in the direction of the scatter layer. The insulating elements can be a resist material, e.g. a polyimide which is applied to electrically insulate different parts of the apparatus, e.g. the first and second electrode surfaces, from one another.

The substrate, the at least one first electrode surface, the at least one functional layer and the at least one second electrode surface may be arranged in this sequence.

The substrate and the first electrode surface may be transparent so that the radiation-emitting apparatus is designed as a so-called "bottom emitter". In this case, the radiation-emitting surface is preferably a surface of the substrate or an encapsulation layer applied onto the substrate. Optionally, the second electrode surface can be transparent so that the radiation-emitting apparatus is designed as a so-called "top emitter". In this case, the radiation-emitting surface is preferably a surface of the second electrode surface or of an encapsulation layer applied onto the second electrode surface. Moreover, the radiation-emitting apparatus can be designed as a "top emitter" and also as a "bottom emitter". In this case, the radiation-emitting apparatus comprises two radiation-emitting surfaces. As already explained above, the radiation-emitting apparatus can then be formed overall to be transparent or at least translucent.

The scatter layer may act by volume scattering. In particular, the scatter layer can comprise a matrix material and scatter particles having a refractive index different from that of the matrix material. Optionally, the scatter layer can act by boundary surface scattering. In particular, at least one boundary surface of the scatter layer, preferably the boundary surface of the scatter layer facing towards the radiation-emitting surface, can have a corrugation or nanostructures or microstructures, e.g. microlenses, micropyramids or microstructures created by roughening. Volume scattering has the advantage over boundary surface scattering that in this case the total reflection on the boundary surfaces of the scatter layer is not disrupted.

The radiation-emitting apparatus may further comprise a low-refractive layer. The low-refractive layer is a layer which in the wavelength range has a low refractive index, preferably a refractive index of 1 to 1.4, particularly preferably 1.1 to 1.3. For example, low-refractive polymers having a refractive index of approximately 1.3 in the visible wavelength range are commercially available. The low-refractive layer can also comprise e.g. silicon dioxide-nanorod structures which in the visible wavelength range have an effective refractive index close to 1 since they consist for the most part of cavities which can be filled with air or nitrogen.

Preferably, the low-refractive layer adjoins the scatter layer and has in the wavelength range a lower refractive index than the scatter layer. This ensures that radiation which impinges upon the low-refractive layer at a sufficiently flat angle is totally reflected and thus remains in the scatter layer so that the radiation in the scatter layer can enter the second region of the apparatus. Preferably, the low-refractive layer is arranged between the functional layer and the scatter layer. This prevents radiation which has been scattered by the scatter layer at a sufficiently flat angle from leaving the scatter layer in the direction of the functional layer. Preferably, the refractive index of the low-refractive layer in the wavelength range is also lower than the refractive index of the first and second electrode surfaces and/or the functional layer.

The low-refractive layer may be arranged between the layer sequence and the scatter layer, in particular between the first electrode surface and the scatter layer.

The scatter layer may be formed by the substrate. This ensures that no additional layer has to be applied to provide a scatter layer.

The scatter layer may be an additional layer different from the substrate. Preferably, this additional layer is arranged on the side of the substrate facing away from the radiation-emitting surface. This ensures that the scatter layer is protected in the interior of the apparatus. For example, the reflection or total reflection on the boundary surfaces of the scatter layer cannot be disrupted by impurities, e.g. fingerprints, on the outer surfaces of the apparatus.

The scatter layer may adjoin the substrate. In particular, the scatter layer is preferably located directly between the substrate and a low-refractive layer, and the substrate preferably likewise has in the wavelength range a lower refractive index than the scatter layer. This ensures that radiation that propagates at a sufficiently flat angle is totally reflected at both boundary surfaces of the scatter layer and thus remains in the scatter layer.

The scatter layer may have a thickness of 1 µm to 5 mm, preferably 50 µm to 500 µm and particularly preferably 100 µm to 200 µm. The thickness of the scatter layer can vary over the scatter layer. As a result, planarization for compensating for different layer thicknesses can be achieved.

The scatter layer may comprise a matrix material and scatter particles having a diameter of 5 nm to 500 nm, preferably 200 nm to 400 nm and particularly preferably 250 nm to 350 nm. Preferably, the scatter particles comprise in the wavelength range a different refractive index than the matrix material. For example, the scatter particles can have a higher refractive index than the matrix material. For this purpose, in particular scatter particles which contain or consist of e.g. titanium oxide, titanium dioxide, aluminum oxide (sapphire) or zirconium oxide are suitable. Optionally, the scatter particles can have a lower refractive index than the matrix material. The scatter particles can contain or consist of e.g. silicon dioxide, or can be formed as pores, e.g. as air-filled pores.

The concentration of the scatter particles may be lower in the first region of the scatter layer than in the second region of the scatter layer. This ensures that a large portion of the radiation which, in the first region of the apparatus, is incident from the functional layer directly upon the scatter layer passes through the scatter layer and is emitted in the first region; that the radiation, which is scattered into the scatter layer, in the first region can propagate in the scatter layer where possible without losses; and that in the second region in which an increased out-coupling of the radiation is desired, the radiation is scattered to an increased extent in angles at which it can exit and can be emitted from the second region of the scatter layer. In particular, the concentration of the scatter particles in the scatter layer can have a gradient, wherein the concentration increases from the first region of the scatter layer towards the second region of the scatter layer. Optionally, the concentration of scatter particles can be constant in the first region of the scatter layer and in the second region of the scatter layer in each case. The thickness of the scatter layer and the concentration of the scatter particles can be used to adjust how much light is scattered into the scatter layer and how much light is scattered out of the scatter layer. The scattering in the first region and in the second region must be adapted to suit one another.

The scatter particles may take up 0.1 to 20 volume percent of the scatter layer. Preferably, the scatter particles in the first region of the scatter layer take up 0.1 to 5 volume percent, particularly preferably 0.1 to 2 volume percent of the scatter layer. Preferably, the scatter particles in the second region of the scatter layer take up 2 to 20 volume percent, particularly preferably 10 to 15 volume percent of the scatter layer. Preferably, the concentration of the scatter particles in the scatter layer is considerably lower than in a typical out-coupling layer, i.e. a layer formed to couple radiation out of the apparatus by scattering.

The scatter layer may be formed such that a homogeneous luminous density is produced on the radiation-emitting surface. Optionally, the scatter layer can be formed to create the subjective impression of a homogeneous luminous density. Since the luminous density at the edge of a luminous surface is perceived to an increased extent subjectively by the contrast with the adjoining non-luminous surface, it can be necessary for this purpose to produce a lower luminous density at the edge of the radiation-emitting surface than in the interior of the radiation-emitting surface. Optionally, a higher luminous density can also be produced if required at the edge of the radiation-emitting surface than in the center. Since the luminous density distribution on the radiation-emitting surface depends in a complicated manner upon the geometry of the apparatus and the properties of the scatter layer, e.g. the distribution of scatter particles in the scatter layer, the properties of the scatter layer, e.g. the distribution of scatter particles in the scatter layer, are advantageously controlled by a computer simulation such that the desired luminous density distribution is achieved.

In the second region of the apparatus a mirror element may be provided, e.g. a reflective layer, which can consist e.g. of silver. The mirror element is preferably located between the first electrode surface and the second region of the scatter layer, particularly preferably between the first electrode surface and the low-refractive layer or between the low-refractive layer and the second region of the scatter layer. This ensures that radiation which in the second region of the apparatus leaves the scatter layer in the direction of the functional layer is reflected in the direction of the scatter layer and is not lost. Since in the second region of the apparatus substantially no radiation is incident in any case from the functional layer directly upon the scatter layer, the mirror element does not limit the radiation which is incident upon the scatter layer.

The apparatus may be mirrored at least partially on at least one surface not provided as a radiation-emitting surface. This ensures that radiation which would otherwise leave the apparatus through the at least one surface is reflected into the apparatus and is not lost.

The radiation-emitting apparatus may comprise an out-coupling element, e.g. an out-coupling layer. Preferably, the out-coupling element is an out-coupling layer in the layer sequence. This ensures that radiation which would otherwise impinge and be reflected, in particular totally reflected, at flat angles upon a boundary surface of the layer sequence, in particular a boundary surface between the layer sequence and the substrate, is scattered and can leave the layer sequence at a more favorable angle. This can be combined with the features of known radiation-emitting apparatuses which comprise internal out-coupling.

Preferably, the radiation-emitting apparatus is formed as a surface which, however, does not have to be planar, but e.g. can also be formed in a flexible manner.

The first electrode surface and/or the second electrode surface preferably contains or consists of a transparent conductive oxide (TCO). Transparent conductive oxides are transparent, conductive materials, generally metal oxides, such as, for example, zinc oxide, tin oxide, cadmium oxide, titanium oxide, indium oxide or indium-tin oxide (ITO). The at least one functional layer preferably comprises an organic functional layer, in particular an organic electroluminescent layer. The radiation-emitting apparatus can be formed as, or can comprise, an organic light-emitting diode (OLED).

For example, a functional region having one or a plurality of functional layers consisting of organic materials can be applied above the first electrode surface. The functional layers may here, for example, take the form of electron transport layers, electroluminescent layers and/or hole transport layers. The second electrode surface can be applied over the functional layers. In the functional layers, electromagnetic radiation of a single wavelength or a range of wavelengths may be generated in an active region by electron and hole injection and recombination. The at least one functional layer can comprise in particular an organic functional layer stack having an organic electroluminescent layer. The organic functional layer stack can comprise e.g. a hole injection layer, a hole transport layer, an electron blocking layer, a hole blocking layer, an electron transport layer and/or an electron injection layer suitable for conducting holes or electrons to the organic electroluminescent layer or blocking the respective transport. Suitable layer structures for the organic functional layer stack are known and not therefore explained any further.

The functional layers may contain or consist of organic polymers, organic oligomers, organic monomers, small organic, non-polymeric molecules ("small molecules") or combinations thereof. Suitable materials and arrangements and structuring of the materials for functional layers are known and not therefore explained any further.

The scatter layer can preferably contain or consist of a transparent material, e.g. glass or a transparent polymer, e.g. a transparent epoxy resin.

The substrate can contain or consist of e.g. glass, quartz, a synthetic material film, metal, a metal foil, a silicon wafer or another suitable substrate material.

Further advantages and developments are apparent from the examples described below in conjunction with the figures.

In the examples and figures, identical or similar elements or elements acting in an identical manner may each be provided with the same reference numerals. The illustrated elements and their size ratios with respect to each other are not to be considered as being to scale. Rather, individual elements such as e.g. layers, components, devices and regions can be illustrated excessively large for improved clarity and/or for improved understanding. This can relate to individual dimensions or to all dimensions of the elements.

Figure 1:
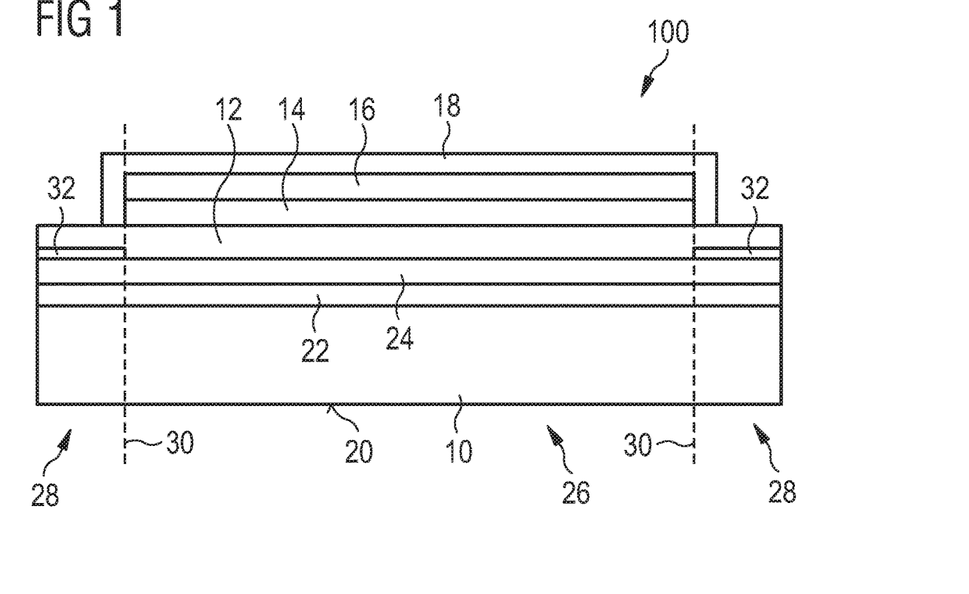
FIG. 1 shows a schematic cross-sectional view of a first example of a radiation-emitting apparatus.

FIG. 1 shows a schematic cross-sectional view of a first example of a radiation-emitting apparatus designated overall by the reference numeral 100. The radiation-emitting apparatus 100 comprises a substrate 10, e.g. a glass substrate. Furthermore, the radiation-emitting apparatus 100 comprises a layer sequence comprising an anode 12 which serves as a first electrode surface, a cathode 16 which serves as a second electrode surface, and a functional layer 14 arranged between the anode 12 and the cathode 16 and is suitable for producing electromagnetic radiation in a wavelength range in a switched-on operating state. An encapsulation layer 18 protects the cathode 16 and the lateral surfaces of the functional layer 14 against external influences. Furthermore, the radiation-emitting apparatus 100 comprises a radiation-emitting surface 20 and a scatter layer 22. Moreover, arranged between the scatter layer 22 and the anode 12 is a low-refractive layer 24, of which the refractive index in the wavelength range is lower than the refractive index of the scatter layer 22. The refractive index of the substrate 10 is, in the wavelength range, lower than the refractive index of the scatter layer 22.

The radiation-emitting apparatus 100 comprises a first region designated overall by the reference numeral 26, and a second region designated overall by the reference numeral 28, in which first and second regions of the scatter layer also lie in each case. The boundary between the first and the second region of the apparatus is designated in FIG. 1 by the reference numeral 30. However, this is not a boundary surface between different materials. The second region 28 surrounds the first region 26 in an annular manner. In the cross-sectional view, the second region 28 splits into two regions on both sides of the first region 26. The functional layer 14 and the cathode 16 are formed in the first region 26 of the apparatus, but not in the second region 28.

The substrate 10, the anode 12, the scatter layer 22 and the low-refractive layer 24 are substantially transmissive to radiation in the wavelength range. Radiation produced in the functional layer 14 can thus penetrate these layers and can be emitted at the radiation-emitting surface 20. Since the functional layer 14 is formed only in the first region 26, this transmitted radiation is emitted substantially only in the first region 26 of the apparatus. However, a portion of the radiation is scattered at the scatter layer 22. Since the scatter layer 22 has, in the wavelength range, a lower refractive index than the low-refractive layer 24 and also the substrate 10, the scattered radiation is totally reflected at the boundary surfaces of the scatter layer 22 if it propagates at a sufficiently flat angle with respect to the boundary surface. The scatter layer 22 thus serves as a waveguide. As a result, radiation incident in the first region 26 upon the scatter layer 22 and scattered at this location can enter the second region 28 in which, in turn, it is scattered at the scatter layer 22 and can be emitted in the second region 28 through the radiation-emitting surface 20. Therefore, the radiation-emitting apparatus 100 emits radiation over the entire radiation-emitting surface 20. By suitably selecting a spatial variation of the scattering power of the scatter layer 22, a homogeneous luminous density or the subjective impression of a homogeneous luminous density can be achieved over the radiation-emitting surface 20.

Provided in the second region 28 of the apparatus between the anode 12 and the low-refractive layer 24 is a silver mirror 32 serving as a mirror element and reflecting radiation which is scattered in the second region 28 by the scatter layer 22 towards the anode 12 so that this radiation can also be emitted in the second region 28 at the radiation-emitting surface 20. Optionally, the silver mirror 32 can also be arranged between the low-refractive layer 24 and the second region of the scatter layer 22 and therefore directly on the second region of the scatter layer 22.

Figure 2:
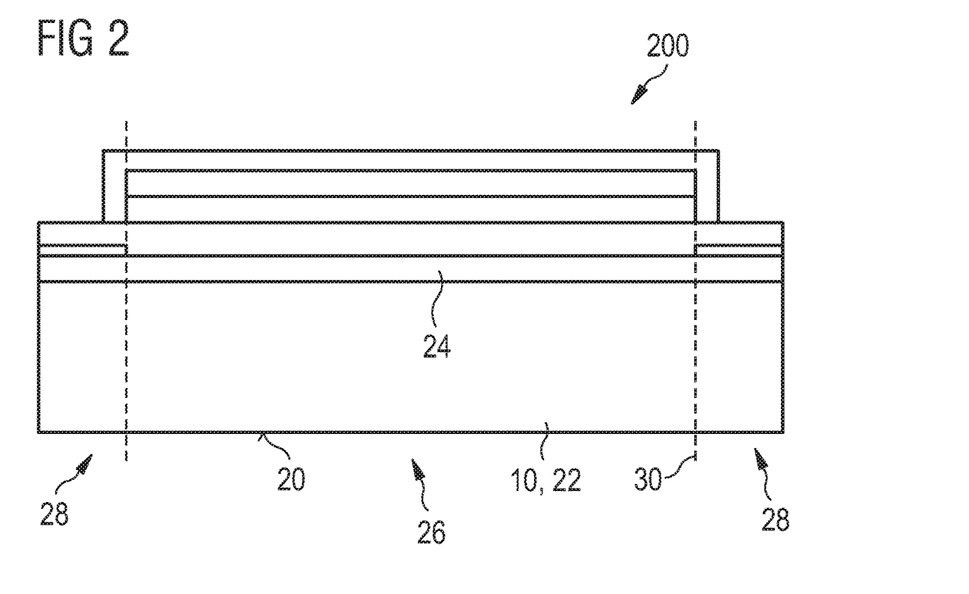
FIG. 2 shows a schematic cross-sectional view of a second example of a radiation-emitting apparatus.

FIG. 2 shows a schematic cross-sectional view of a second example of a radiation-emitting apparatus designated overall by the reference numeral 200. The radiation-emitting apparatus 200 comprises extensively the same structure as the radiation-emitting apparatus 100; therefore, only those elements in which the radiation-emitting apparatus 200 differs from the radiation-emitting apparatus 100 will be described in greater detail.

The radiation-emitting apparatus 200 of the second example does not comprise a separate scatter layer. Instead, the substrate 10 serves as the scatter layer in this case. A low-refractive layer 24 is also arranged above the substrate 10 which serves as the scatter layer. Since the air beyond the substrate 10 has, in the wavelength range, a refractive index close to 1 which is lower than the refractive index of the substrate, total reflection also takes place at the radiation-emitting surface 20 if radiation propagates at a sufficiently flat angle in the substrate 10 which serves as the scatter layer. Therefore, radiation is also guided from the first region 26 into the second region 28 after repeated reflection at the boundary surfaces of the substrate 10 which serves as the scatter layer.

Figure 3:
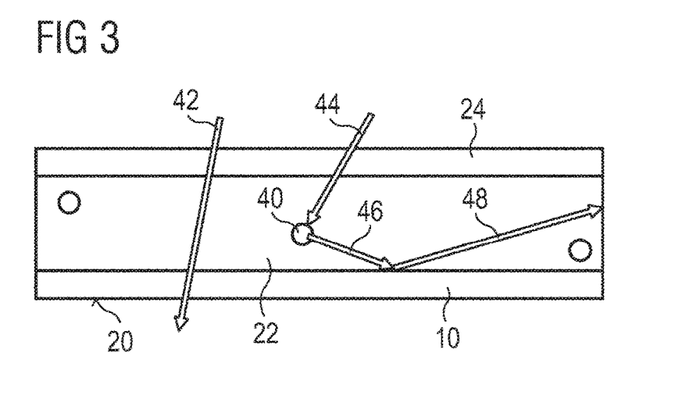
FIG. 3 shows a schematic view of beam progressions in the first region of the scatter layer of the first example of a radiation-emitting apparatus.

FIG. 3 shows a schematic view of beam progressions in the first region of the scatter layer of the first example of a radiation-emitting apparatus 100. In this case, the scatter layer 22 acts by volume scattering on scatter particles 40 distributed in the scatter layer 22. Radiation 42 not impinging upon a scatter particle 40 passes through the low-refractive layer 24, the scatter layer 22 and the substrate 10 and is emitted at the radiation-emitting surface 20. Radiation 44 impinging upon a scatter particle 40 is scattered against the same. FIG. 3 shows radiation 44 scattered at a scatter particle 40 such that the scattered radiation 46 impinges at a sufficiently flat angle upon the boundary surface between the scatter layer 22 and the substrate 10 that it is totally reflected at this location. The reflected radiation 48 propagates further in the scatter layer 22 and reaches the second region of the scatter layer 22, optionally after further reflections at the boundary surfaces of the scatter layer 22.

Figure 4:
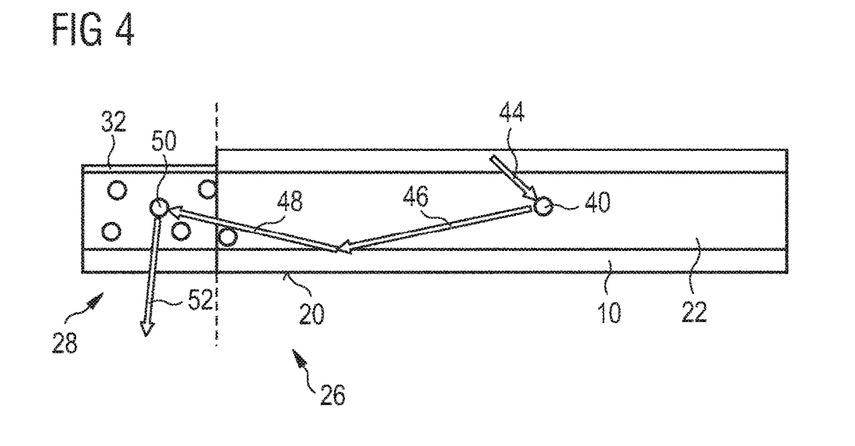
FIG. 4 shows a schematic view of a beam progression in the scatter layer of the first example of a radiation-emitting apparatus.

FIG. 4 shows a schematic view of a beam progression in the scatter layer of the first example of a radiation-emitting apparatus 100. A portion of the first region 26 of the apparatus and also a portion of the second region 28 of the apparatus are shown here. Again, radiation 44 impinging upon a scatter particle 40 is scattered at the particle such that the scattered radiation 46 impinges at a sufficiently flat angle upon the boundary surface between the scatter layer 22 and the substrate 10 to be totally reflected at this location. The reflected radiation 48 propagates further in the scatter layer 22 and reaches the second region of the scatter layer 22. At this location, there is a considerably higher concentration of scatter particles 40 in advance of the first region of the scatter layer 22 than in the region. Therefore, a large portion of the radiation 48 directed into the second region of the scatter layer 22 again impinges upon a scatter particle 50 at this location. FIG. 4 shows radiation scattered at the scatter particle 50 in the direction of the radiation-emitting surface 20. The scattered radiation 52 passes through the substrate 10 and is emitted by the radiation-emitting surface 20. However, if radiation directed into the second region of the scatter layer 22 is scattered by a scatter particle 50 in the direction of the silver mirror 32 which is shown arranged directly on the second region of the scatter layer 22, it is reflected by the silver mirror, passes once again through the scatter layer 22 and the substrate 10 and is then emitted at the radiation-emitting surface 20.

Figure 5:
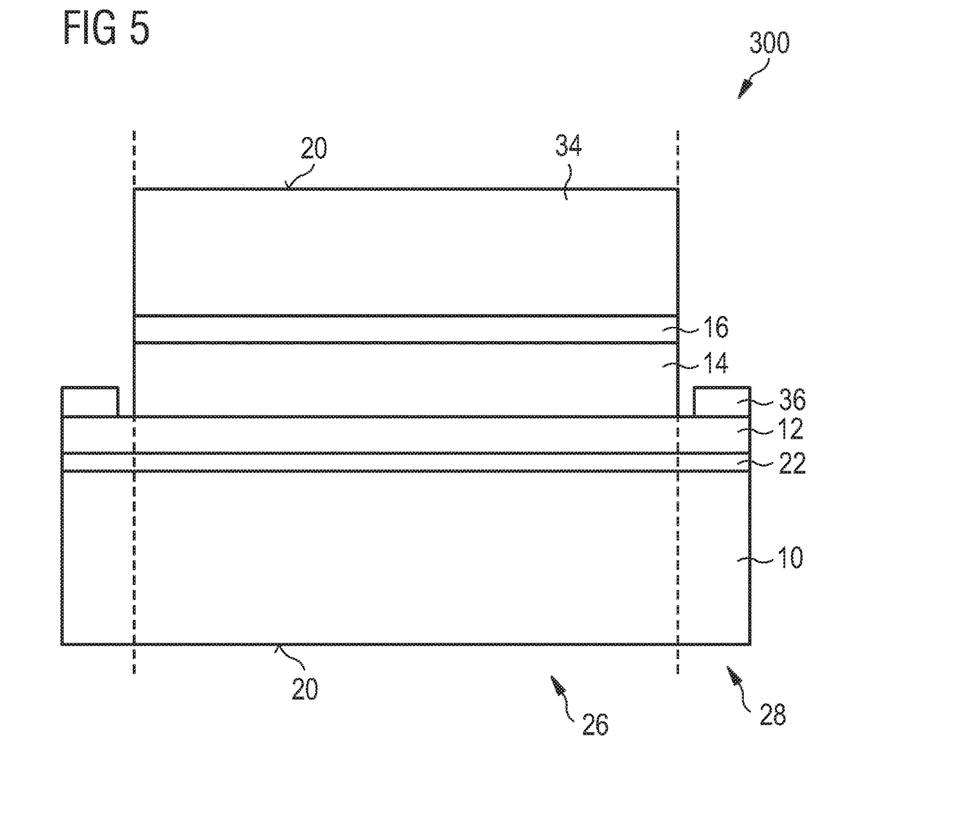
FIG. 5 shows a schematic cross-sectional view of a third example of a radiation-emitting apparatus.

FIG. 5 shows a schematic cross-sectional view of a third example of a radiation-emitting apparatus designated overall by the reference numeral 300. The radiation-emitting apparatus 300 comprises extensively the same structure as the radiation-emitting apparatus 100. Therefore, only those elements in which the radiation-emitting apparatus 300 differs from the radiation-emitting apparatus 100 will be described in greater detail.

The radiation-emitting apparatus 300 of the third example is formed on the whole to be transparent or at least translucent, in particular it is formed as a transparent OLED. In this case, the first region of the apparatus 26 and also the second region of the apparatus 28 (in particular all of the elements arranged in these regions) are formed to be transparent or at least translucent. The second region 28 does not have any mirror elements 32 arranged therein, but instead, has contact elements 36 arranged therein which are likewise formed to be transparent or at least translucent. The radiation-emitting apparatus 300 comprises two opposite radiation-emitting surfaces 20.

The radiation-emitting apparatus 300 does not comprise a separate low-refractive layer. However, in one example not illustrated, it is provided in the same manner as in the example shown in FIG. 1.

Arranged on the transparent cathode 16 is an encapsulation element 34 comprising a laminating adhesive layer and a cover glass.

The scatter layer 22 acting as a waveguide has a higher refractive index than the substrate 10. Light which cannot leave the radiation-emitting apparatus 300 traverses the scatter layer 22 until it is completely damped or a scatter event occurs in the scatter layer 22.

If a scatter event occurs in the scatter layer 22 then there is the possibility that light will be captured in the scatter layer 22. This light then propagates into the part of the scatter layer 22 located in the second region 28. At this location, the concentration of the scatterers in the scatter layer 22 increases so that the light can then leave the scatter layer 22 and can also leave the radiation-emitting apparatus 300 if the scatter angle is suitable. By adapting the scatter concentrations to the surface and the thickness of the scatter layer 22, a homogeneous brightness impression can be achieved over the entire device. In this manner, e.g. a transparent, fully luminous OLED can be provided.

In a further example not illustrated, the radiation-emitting apparatus is likewise formed on the whole to be transparent or at least translucent, in particular, it is formed as a transparent OLED. In a similar manner to the example illustrated in FIG. 2, the radiation-emitting apparatus does not comprise a separate scatter layer. Instead, the substrate serves as a scatter layer. As a result, light which cannot leave the substrate by reason of its angle of propagation is captured in the substrate. By total reflection, as described above, the light is prevented from returning to the upper part of the radiation-emitting apparatus so that an absorption of the light is reduced and the light can cover travel greater distances in the radiation-emitting apparatus.

By suitably adjusting the scatter length in the scatter layer e.g. by selecting the concentration of scatter particles, it is possible to produce scattering not perceived by the human eye when looking through the scatter layer because the light traversing the scatter layer is scattered only to a small extent.

If the scatter length is much greater than the thickness of the scatter layer, then it is highly unlikely that the light will interact with the scatter particles in the scatter layer. As a result, the scatter layer appears to be transparent.

However, if the light moves along the scatter layer and if the lateral extent of the scatter layer is much larger than the thickness thereof, then the propagation length is greater than the scatter length and the light is scattered.

If in the scatter layer, as described above, an inhomogeneous scatter concentration is provided in which the scatter particle concentration is greater below the unilluminated region of the radiation-emitting apparatus, then the light previously coupled into the scatter layer is scattered at this location and leaves the radiation-emitting apparatus.

As a result, the unilluminated edge of the transparent radiation-emitting apparatus is perceived to be luminous.

This patent application claims the priority of German patent application 102013108039.1, the disclosure content of which is hereby incorporated by reference.

The invention claimed is:

1. A radiation emitting apparatus comprising:
   a substrate,
   at least one layer sequence arranged on the substrate and producing electromagnetic radiation in a wavelength range, having
      at least one first electrode surface,
      at least one second electrode surface, and
      at least one functional layer between the first electrode surface and the second electrode surface, wherein the functional layer produces electromagnetic radiation in the wavelength range in a switched-on operating state, and
   a scatter layer having a first region and a second region, wherein radiation produced by the functional layer is directly incident on the scatter layer only in the first region of the scatter layer, and the scatter layer at least partially scatters radiation incident upon the first region of the scatter layer so that said radiation enters the second region of the scatter layer.

2. The radiation-emitting apparatus according to claim 1, wherein the radiation-emitting apparatus is an organic light-emitting diode.

3. The radiation-emitting apparatus according to claim 1, wherein the scatter layer comprises a matrix material and scatter particles having a refractive index different from that of the matrix material.

4. The radiation-emitting apparatus according to claim 3, wherein the concentration of scatter particles in the first region of the scatter layer is lower than that in the second region of the scatter layer.

5. The radiation-emitting apparatus according to claim 3, wherein the scatter particles in the first region of the scatter layer take up 0.1 to 5 volume percent of the scatter layer and the scatter particles in the second region of the scatter layer take up 2 to 20 volume percent of the scatter layer.

6. The radiation-emitting apparatus according to claim 3, wherein the scatter particles have a diameter of 5 nm to 1000 nm.

7. The radiation-emitting apparatus according to claim 1, further comprising a low-refractive layer arranged between the functional layer and the scatter layer, said low-refractive layer having, in the wavelength range, a lower refractive index than that of the scatter layer.

8. The radiation-emitting apparatus according to claim 1, wherein the scatter layer is formed by the substrate.

9. The radiation-emitting apparatus according to claim 1, wherein the scatter layer is an additional layer different from the substrate.

10. The radiation-emitting apparatus according to claim 1, wherein the radiation-emitting apparatus is at least partially mirrored on at least one surface not provided as a radiation-emitting surface.

11. The radiation-emitting apparatus according to claim 1, further comprising a mirror element arranged between the first electrode surface and the second region of the scatter layer.

12. The radiation-emitting apparatus according to claim 1, wherein the first region of the scatter layer is a central region of the scatter layer and the second region of the scatter layer is an edge region of the scatter layer.

13. The radiation-emitting apparatus according to claim 1, wherein the second region of the scatter layer at least partially surrounds the first region of the scatter layer.

14. The radiation-emitting apparatus according to claim 13, wherein the second region of the scatter layer surrounds the first region of the scatter layer in an annular manner.

15. The radiation-emitting apparatus according to claim 1, wherein the radiation-emitting apparatus is formed at least in a sub-region or overall to be transparent or at least translucent.

16. A radiation emitting apparatus comprising:
   a substrate,
   at least one layer sequence arranged on the substrate and producing electromagnetic radiation in a wavelength range, having
      at least one first electrode surface,
      at least one second electrode surface, and
      at least one functional layer between the first electrode surface and the second electrode surface, wherein the functional layer produces electromagnetic radiation in the wavelength range in a switched-on operating state, and
   a scatter layer having a first region and a second region, wherein
      radiation produced by the functional layer is directly incident on the scatter layer only in the first region of the scatter layer,
      the scatter layer comprises a matrix material and scatter particles having a refractive index different from that of the matrix material,
      the scatter particles in the first region of the scatter layer take up 0.1 to 5 volume percent of the scatter layer and the scatter particles in the second region of the scatter layer take up 2 to 20 volume percent of the scatter layer, and
      the scatter layer at least partially scatters radiation incident upon the first region of the scatter layer so that said radiation enters the second region of the scatter layer.

17. The radiation emitting apparatus according to claim 16, wherein a concentration of the scatter particles in the first region of the scatter layer is 0.1 to 5 volume percent of the scatter layer and a concentration of the scatter particles in the second region is 10 to 20 volume percent of the scatter layer.

18. The radiation emitting apparatus according to claim 16, wherein a low-refractive layer is arranged between the functional layer and the scatter layer, said low-refractive layer having, in the wavelength range, a lower refractive index than that of the scatter layer.

19. A radiation emitting apparatus comprising:
   a substrate,
   at least one layer sequence arranged on the substrate and producing electromagnetic radiation in a wavelength range, having
      at least one first electrode surface,
      at least one second electrode surface, and
      at least one functional layer between the first electrode surface and the second electrode surface, wherein the functional layer produces electromagnetic radiation in the wavelength range in a switched-on operating state, and
   a scatter layer having a first region and a second region, wherein radiation produced by the functional layer is directly incident on the scatter layer only in the first region of the scatter layer, the scatter layer at least partially scatters radiation incident upon the first region of the scatter layer so that said radiation enters the second region of the scatter layer, and the radiation-emitting apparatus is formed at least in a sub-region or overall to be transparent or at least translucent.

20. The radiation emitting apparatus according to claim 19, which comprises two radiation-emitting surfaces so that the radiation-emitting apparatus is configured as a top emitter and a bottom emitter.

* * * * *